United States Patent
Chi et al.

(10) Patent No.: US 9,958,972 B2
(45) Date of Patent: May 1, 2018

(54) TOUCH PANEL AND COVER PLATE STRUCTURE AND SENSING STRUCTURE THEREOF

(71) Applicant: TPK Touch Solutions (Xiamen) Inc., Xiamen (CN)

(72) Inventors: Ho-Hsun Chi, Hsinchu (TW); Bin Lai, Fuzhou (CN); Xianbin Xu, Xiamen (CN); Fenghui Feng, Xiamen (CN)

( * ) Notice: Subject to any disclaimer, the term of this patent is extended or adjusted under 35 U.S.C. 154(b) by 178 days.

(21) Appl. No.: 14/902,347

(22) PCT Filed: Jun. 17, 2014

(86) PCT No.: PCT/CN2014/080035
§ 371 (c)(1),
(2) Date: Dec. 31, 2015

(87) PCT Pub. No.: WO2015/000360
PCT Pub. Date: Jan. 8, 2015

(65) Prior Publication Data
US 2016/0370889 A1    Dec. 22, 2016

(30) Foreign Application Priority Data

Jul. 2, 2013   (CN) .......................... 2013 1 0274699

(51) Int. Cl.
*G06F 3/041* (2006.01)
*G06F 3/044* (2006.01)
*H03K 17/96* (2006.01)

(52) U.S. Cl.
CPC .............. *G06F 3/041* (2013.01); *G06F 3/044* (2013.01); *H03K 17/962* (2013.01); *G06F 2203/04107* (2013.01); *H03K 2017/9602* (2013.01); *H03K 2217/960765* (2013.01); *H03K 2217/960775* (2013.01)

(58) Field of Classification Search
CPC ..................... G06F 3/041; G06F 3/044; G06F 2203/04107; H03K 17/962; H03K 2217/960775; H03K 2217/960765; H03K 2017/9602
See application file for complete search history.

(56) References Cited

U.S. PATENT DOCUMENTS

2011/0025640 A1* 2/2011 Lin .......................... G06F 3/044
                                                           345/174
2011/0279405 A1* 11/2011 Meng ..................... G06F 3/044
                                                           345/174

(Continued)

*Primary Examiner* — Jonathan Boyd

(57) ABSTRACT

The disclosure provides a sensing structure of a touch panel, which includes a shielding layer and a sensing layer. The shielding layer is provided with one hollow portion, and the sensing layer is arranged under the shielding layer and located around the hollow portion. The disclosure further provides a cover plate structure of a touch panel and the touch panel. In the touch panel, the cover plate structure of the touch panel and the sensing structure of a touch panel provided by the disclosure, the sensing layer is located under the shielding layer and around the hollow portion. Thus, the sensing layer is covered by the shielding layer and avoids the hollow portion of a pattern zone, so that the sensing layer cannot be seen through the hollow portion, and the appearance quality of the touch panel is improved.

18 Claims, 8 Drawing Sheets

(56) References Cited

U.S. PATENT DOCUMENTS

| | | | | |
|---|---|---|---|---|
| 2014/0218641 A1* | 8/2014 | Chen | ............... | G06F 3/041 349/12 |
| 2014/0322492 A1* | 10/2014 | Lin | ............... | G06F 1/181 428/166 |
| 2015/0009423 A1* | 1/2015 | Wang | ............... | G06F 1/169 349/12 |

* cited by examiner

TOUCH PANEL AND COVER PLATE STRUCTURE AND SENSING STRUCTURE THEREOF

BACKGROUND OF THE INVENTION

This application claims priority to Chinese Application Serial Number 201310274699.6, filed Jul. 2, 2013, which is herein incorporated by reference.

FIELD OF INVENTION

The disclosure relates to touch technology. More particularly, the disclosure relates to touch panels, cover plate structures of touch panels, and sensing structures of touch panels.

DESCRIPTION OF RELATED ART

In today's consumer electronics market, it has become a mainstream development tendency of portable electronics to integrate touch functions in displays. Touch panels have been applied in various electronic devices, such as smart phones, mobile phones, tablet computers and notebook computers. A user can operate and give instructions directly through touching patterns displaying on a screen, so that the touch panel provides a natural user interface between the user and the electronic device.

FIG. 1A is a schematic diagram showing a conventional touch panel structure, and FIG. 1B is a cross-sectional view taken along a line AA' of FIG. 1A. Referring to FIG. 1A and FIG. 1B, a touch panel 100 includes a cover plate 10, and the cover plate 10 is divided into a visible area VA and a non-visible area NA. Light can pass through the visible area VA, and a user can perform touch operations on the visible area VA. The non-visible area NA is usually located surrounding the visible area VA, and an opaque shielding layer 11 and a sensing layer 12 are formed on the non-visible area NA. The shielding layer 11 has a hollow portion 13 to form patterns representing keys with different functions, such as function keys of home, return and select. The sensing layer 12 is a continuous layer structure, and is located under the shielding layer 11 and covers or spans the hollow portion 13 to make the pattern formed by the hollow portion 13 have a touch operation function.

However, the sensing layer 12 covers or spans the hollow portion 13, so that the sensing layer 12 can be seen through the hollow portion 13 from outside the touch panel 100. Thus, it is easy to degrade the appearance quality of the touch panel 100.

SUMMARY OF THE INVENTION

The disclosure provides a touch panel, a cover plate structure of the touch panel and a sensing structure of a touch panel, in which a sensing layer avoids a hollow portion of a pattern zone, so that the sensing layer cannot be seen through the hollow portion, and the appearance quality of the touch panel is enhanced.

Embodiments of the disclosure provide a sensing structure of a touch panel including a shielding layer and a sensing layer, in which the shielding layer has a hollow portion, and the sensing layer is arranged under the shielding layer and located around the hollow portion.

According to one or more embodiments of the disclosure, the sensing layer does not overlap with the hollow portion.

According to one or more embodiments of the disclosure, the shielding layer has a pattern zone composed of the hollow portion and a non hollow portion, and the hollow portion is located around the non hollow portion.

According to one or more embodiments of the disclosure, the shielding layer has a pattern zone composed of the hollow portion and a non hollow portion, and the non hollow portion is located around the hollow portion.

According to one or more embodiments of the disclosure, the sensing layer includes at least one first electrode and at least one second electrode, the first electrode and the second electrode are alternately arranged and surround the pattern zone, and the first electrode and the second electrode are electrically insulated from one another.

According to one or more embodiments of the disclosure, materials of the first electrode and the second electrode are opaque conductive materials.

According to one or more embodiments of the disclosure, the first electrode includes various first circular arcs and a first connection portion connecting the first circular arcs, the second electrode includes various second circular arcs and a second connection portion connecting the second circular arcs, the first circular arcs and the second circular arcs are alternately arranged, the second connection portion is located in a first opening zone formed by the first circular arcs, and the first connection portion is located in a second opening zone formed by the second circular arcs.

According to one or more embodiments of the disclosure, the first electrode includes a first conductive portion and a second conductive portion arranged along a first direction opposite to each other, a first connection portion connected to the first conductive portion and a second connection portion connected to the second conductive portion, a first opening zone and a second opening zone are formed between the first conductive portion and the second conductive portion in a second direction, the second electrode includes a third conductive portion and a fourth conductive portion arranged along the second direction opposite to each other, a third connection portion connected to the third conductive portion and a fourth connection portion connected to the fourth conductive portion, a third opening zone and a fourth opening zone are formed between the third conductive portion and the fourth conductive portion in the first direction, the first connection portion and the second connection portion are respectively located in the third opening zone and the fourth opening zone, the third connection portion and the fourth connection portion are respectively located in the first opening zone and the second opening zone, and the first conductive portion and the second conductive portion are alternately arranged with the third conductive portion and the fourth conductive portion respectively at two opposite sides of the pattern zone.

According to one or more embodiments of the disclosure, the first electrode includes various first circular rings and a first connection portion connecting the first circular rings, the second electrode includes various second circular rings and a second connection portion connecting the second circular rings, the first circular rings and the second circular rings are alternately arranged, a first insulation bump is disposed between the first circular rings and the second connection portion, and a second insulation bump is disposed between the second circular rings and the first connection portion.

According to one or more embodiments of the disclosure, the sensing layer includes a first electrode and a second electrode, the first electrode includes a first vertical pole portion and various first horizontal pole portions, the first horizontal pole portions are parallel to each other and electrically connected to each other through the first vertical pole portion, the second electrode includes a second vertical pole portion and various second horizontal pole portions, the second horizontal pole portions are parallel to each other and electrically connected to each other through the second vertical pole portion, the first vertical pole portion and the second vertical pole portion are parallel to each other, the first horizontal pole portions and the second horizontal pole portions are parallel to each other, various gaps are formed between the first horizontal pole portions and the second horizontal pole portions, and the hollow portion is located in the gaps.

According to one or more embodiments of the disclosure, the shielding layer includes various opaque insulation layers stacked with one another.

According to one or more embodiments of the disclosure, the shielding layer includes a first insulation layer, a second insulation layer, a third insulation layer and a fourth insulation layer, and the first insulation layer, the second insulation layer, the third insulation layer and the fourth insulation layer are sequentially stacked along a direction toward the sensing layer.

According to one or more embodiments of the disclosure, side surfaces of the first insulation layer and the second insulation layer adjacent to one side of the hollow portion form a shape of a ladder.

According to one or more embodiments of the disclosure, the first insulation layer, the second insulation layer and the third insulation layer are formed form a white insulating printing ink, and the fourth insulation layer is formed from a black insulating printing ink.

According to one or more embodiments of the disclosure, the sensing structure of a touch panel further includes a fifth insulation layer disposed between the sensing layer and the shielding layer.

According to one or more embodiments of the disclosure, a material of the fifth insulation layer is a transparent insulating organic material or a transparent insulating inorganic material.

The embodiments of the disclosure further provide a cover plate structure of a touch panel, which includes a cover plate and one of the aforementioned sensing structures of a touch panel. The sensing structure of a touch panel is disposed on the cover plate, and the shielding layer is located between the cover plate and the sensing layer.

According to one or more embodiments of the disclosure, the cover plate structure further includes a conductive layer, the shielding layer divides the cover plate into a visible area and a non-visible area, the shielding layer is located in the non-visible area, and the conductive layer is disposed on the cover plate in the visible area.

The embodiments of the disclosure further provide a touch panel, which includes a cover plate having a visible area and a non-visible area; a substrate located under the cover plate; one of the aforementioned sensing structures of a touch panel disposed on the cover plate and located in the non-visible area; and a conductive layer disposed on the substrate in the visible area.

In the touch panel, the cover plate structure of the touch panel and the sensing structure of the touch panel provided by the embodiments of the disclosure, the sensing layer is located under the shielding layer and around the hollow portion, so that the sensing layer is covered by the shielding player and avoids the hollow portion of the pattern zone.

Thus, the sensing layer cannot be seen through the hollow portion, and the appearance quality of the touch panel is enhanced.

DETAILED DESCRIPTION OF THE INVENTION

Figure 1A:
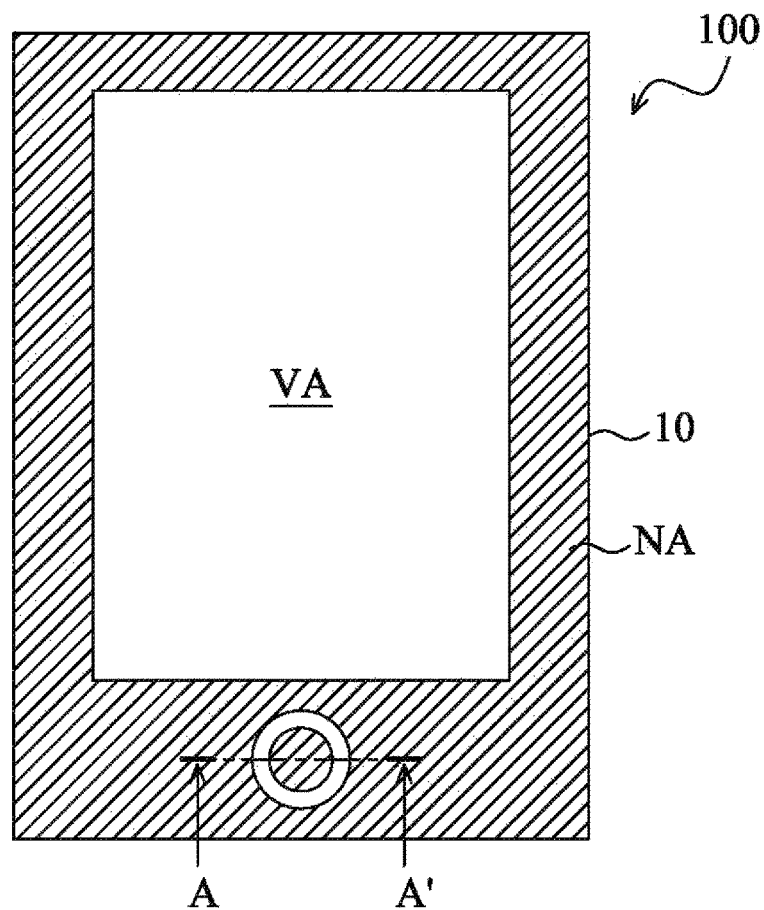
FIG. 1A is a schematic diagram showing a conventional touch panel structure.
Figure 1B:
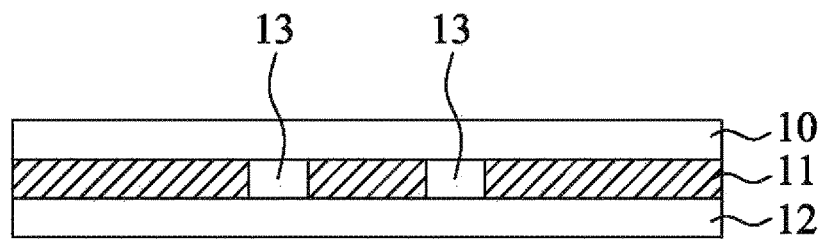
FIG. 1B is a cross-sectional view taken along a line AA' of FIG. 1A.
Figure 2A:
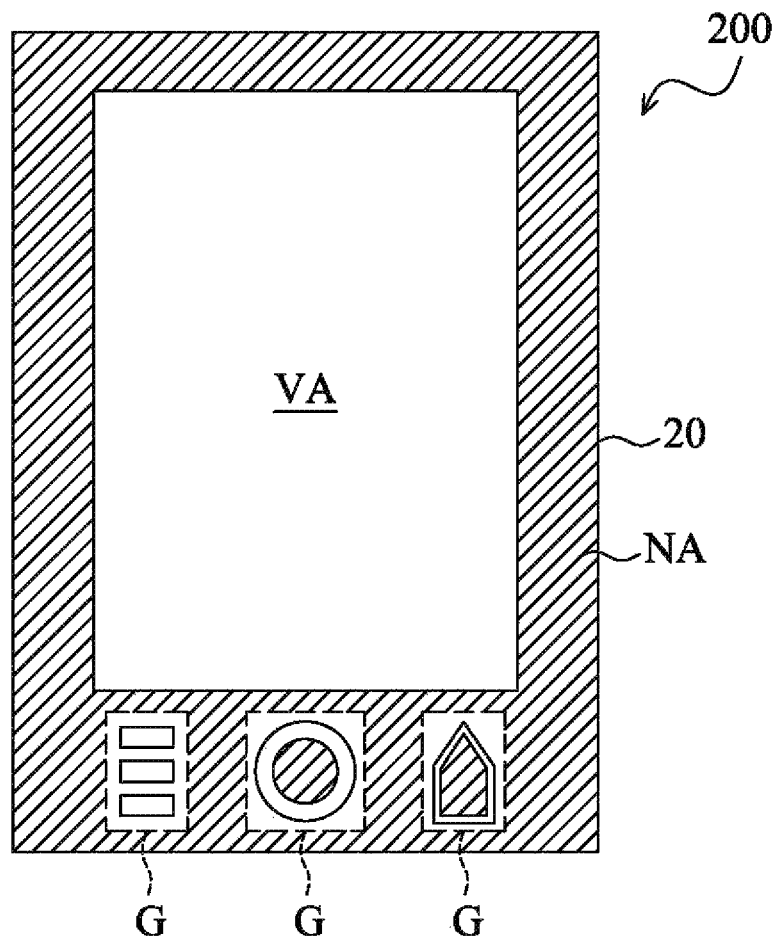
FIG. 2A is a schematic diagram showing a cover plate structure of a touch panel in accordance with one or more embodiments of the disclosure.
Figure 2B:
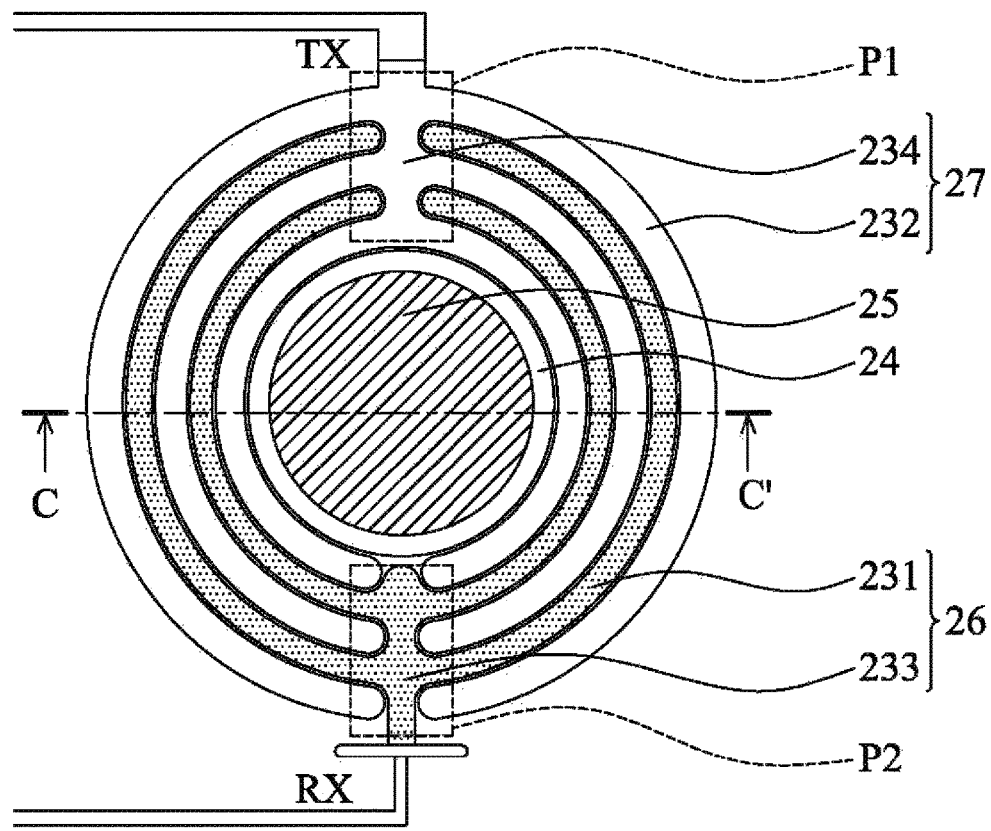
FIG. 2B is an enlarged drawing of a pattern zone of FIG. 2A in accordance with one or more embodiments of the disclosure.
Figure 2C:
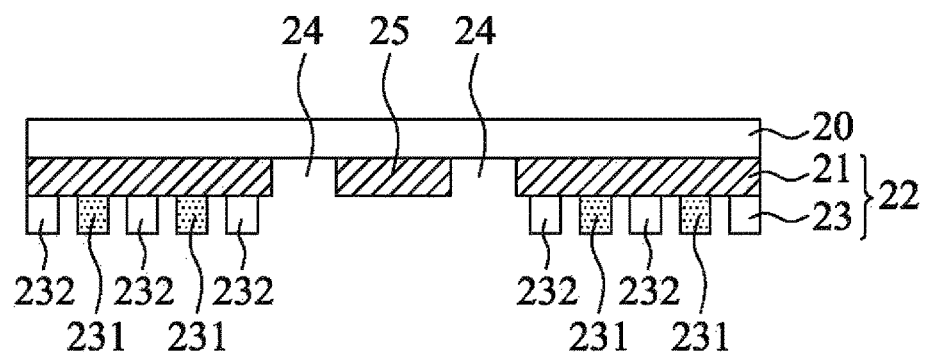
FIG. 2C is a cross-sectional view taken along a line CC' of FIG. 2B in accordance with one or more embodiments of the disclosure.

FIG. 2A is a schematic diagram showing a cover plate structure of a touch panel in accordance with one or more embodiments of the disclosure. FIG. 2B is an enlarged drawing of a pattern zone of FIG. 2A in accordance with one or more embodiments of the disclosure. FIG. 2C is a cross-sectional view taken along a line CC' of FIG. 2B in accordance with one or more embodiments of the disclosure.

Referring to FIG. 2A through FIG. 2C simultaneously, a cover plate structure 200 of a touch panel in some embodiments includes a cover plate 20 and a sensing structure of a touch panel 22. A user can directly contact the cover plate 20 for touch operation. The cover plate 20 is divided into a visible area VA and a non-visible area NA, in which the non-visible area NA is usually located at at least one side of the visible area VA. For example, the non-visible area NA surrounds the visible area VA, or is located at opposite sides of the visible area VA, or is only located at one side of the visible area VA.

The sensing structure of the touch panel 22 is disposed on the cover plate 20 and is located in the visible area VA. The sensing structure of the touch panel 22 includes a shielding layer 21 and a sensing layer 23. The shielding layer 21 is usually formed from an opaque insulation material, such as a black or white insulating printing ink. The shielding layer 21 is disposed under the cover plate 20 to define the non-visible area NA of the cover plate 20, and the shielding layer 21 can be used to shield circuit devices in the non-visible area NA.

The shielding layer 21 has a hollow portion 24, and the hollow portion 24, in some embodiments, forms patterns representing keys of different functions, such as function keys of home, return and select. In some embodiments, the hollow portion 24 is substantially devoid of opaque insulation material. The sensing layer 23 is arranged under the shielding layer 21 and is located around the hollow portion 24, the sensing layer 23 does not overlap with the hollow portion 24, so that the sensing layer 23 avoids the hollow portion 24 to prevent the sensing layer 23 from being seen through the hollow portion 24 from the top of the cover plate 20, thereby enhancing the appearance quality of the touch panel. Furthermore, the sensing layer 23 does not cross the level difference between the shielding layer 21 and the hollow portion 24, which reduces risk of fracture in the sensing layer 23.

Usually, in order to differentiate the different function keys, the patterns of the hollow portion 24 are different. For example, the "home" function key is usually in a shape of a circular ring, and the "return" function key is usually in a shape of an arrow directing to a left-hand side. The pattern corresponding to each function key is defined as a pattern zone G herein, the shielding layer 21 has at least one pattern zone G. In FIG. 2A, three pattern zones G are illustrated for example, but not limited to. The pattern zone G is composed of the hollow portion 24 and a non hollow portion 25. The hollow portion 24 is located around the non hollow portion 25. In some embodiments, the pattern of the pattern zone G is a function key pattern in a shape of a circular ring. In some embodiments, for patterns of other shapes, the non hollow portion is located around the hollow portion. In some embodiments, the sensing layer 23 surrounds the pattern zone G, and does not overlap the hollow portion 24 and the non hollow portion 25.

Please refer to FIG. 2B and FIG. 2C. The sensing layer 23 includes at least one electrode 26 and at least one second electrode 27. The first electrode 26 and the second electrode 27 are alternately arranged and surround the pattern zone G, and the first electrode 26 and the second electrode 27 are electrically insulated from one another. The first electrode 26 and the second electrode 27 may be respectively connected to a controller (not shown), in which one of the first electrode 26 and the second electrode 27 is used as a drive electrode RX to receive a drive signal, and the other one of the first electrode 26 and the second electrode 27 is used as an emitting electrode TX to transmit the sensed signal to the controller. In some embodiments, capacitance is formed between the first electrode 26 and the second electrode 27. When a touch object contacts or approaches the sensing layer 23, the capacitance value between the first electrode 26 and the second electrode 27 is changed, so that it can determine whether the pattern located in the location is touched or not through detecting the capacitance value.

In some embodiments, the first electrode 26 includes first circular arcs 231 and a first connection portion 233 connecting the first circular arcs 231, and the second electrode 27 includes second circular arcs 232 and a second connection portion 234 connecting the second circular arcs 232. The first circular arcs 231 and the second circular arcs 232 are alternately arranged. Because each of the first circular arcs 231 and the second circular arcs 232 is in a shape of an arc and not a closed structure, the first circular arcs 231 form a first opening zone P1, and the second circular arcs 232 form a second opening zone P2. The first opening zone P1 and the second opening zone P2 are preferably located at two opposite sides of the hollow portion 24, the second connection portion 234 is located in the first opening zone P1 formed by the first circular arcs 231, and the first connection portion 233 is located in the second opening zone P2 formed by the second circular arcs 232. Thus, the first electrode 26 and the second electrode 27 are electrically insulated from one another. It is worth describing that the shape of the first circular arcs 231 and the second circular arcs 232 are not limited to a circular arc and can be designed according to a shape of a real pattern, such as a non-closed annular. Various common sensing layer structures are illustrated further below.

Figure 3A:
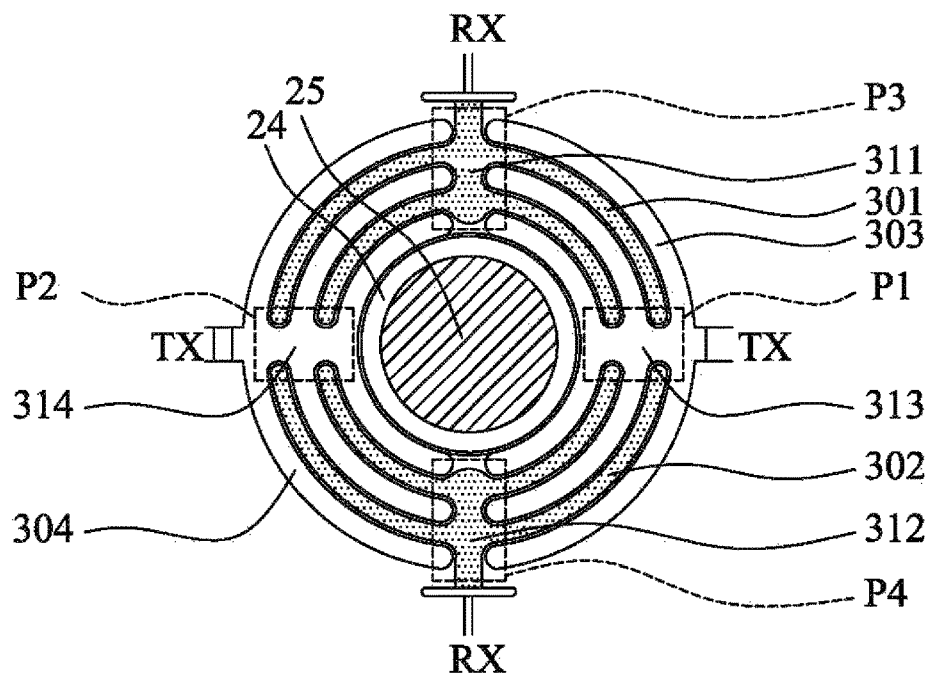
FIG. 3A is a schematic diagram showing a pattern zone sensing structure in accordance with one or more embodiments of the disclosure.
Figure 3B:
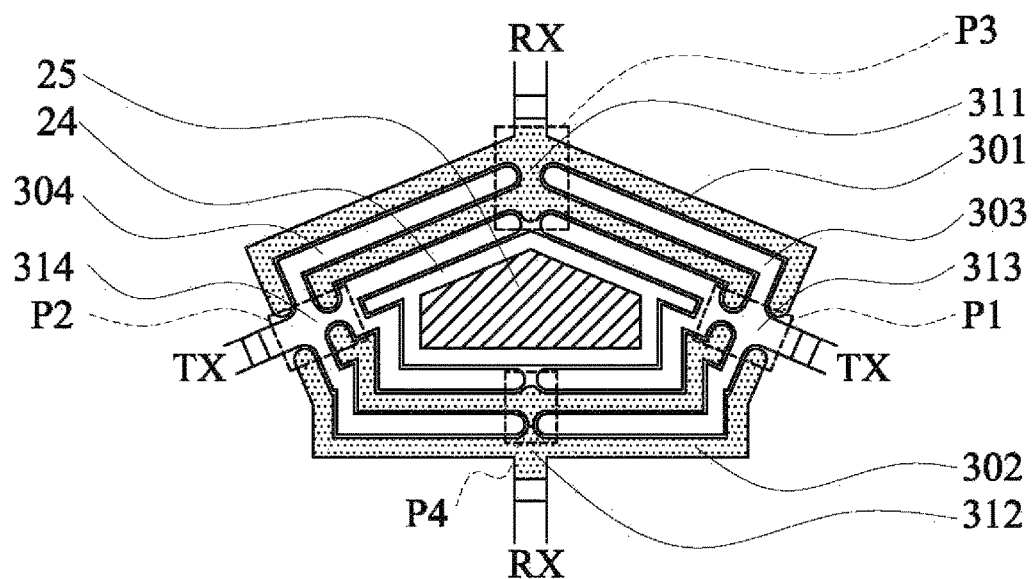
FIG. 3B is a schematic diagram showing a pattern zone sensing structure in accordance with some other embodiments of the disclosure.

FIG. 3A is a schematic diagram showing a pattern zone sensing structure in accordance with one or more embodiments of the disclosure. FIG. 3B is a schematic diagram showing a pattern zone sensing structure in accordance with some other embodiments of the disclosure.

Referring to FIG. 3A and FIG. 3B simultaneously, the difference between the pattern zone sensing structure of the present embodiments and the embodiments shown in FIG. 2B is that the specific structures of the sensing layers are different.

A first electrode includes first conductive portions 301, second conductive portions 302, a first connection portion 311 and a second connection portion 312. The first conductive portions 301 and the second conductive portions 302 are arranged at two opposite sides of a hollow portion 24 along a first direction, and a first opening zone P1 and a second opening zone P2 are formed between the first conductive portions 301 and the second conductive portions 302 in a second direction. With the first opening zone P1 and the second opening zone P2, the first conductive portions 301 and the second conductive portions 302 do not contact one another. The first direction is different from the second direction, and is preferably perpendicular to the second direction. The first connection portion 311 electrically connects all the first conductive portions 301, and the second connection portion 312 electrically connects all the second conductive portions 302.

A second electrode includes third conductive portions 303, fourth conductive portions 304, a third connection portion 313 and a fourth connection portion 314. The third conductive portions 303 and the fourth conductive portions 304 are arranged at two opposite sides of the hollow portion 24 along the second direction, and a third opening zone P3 and a fourth opening zone P4 are formed between the third conductive portions 303 and the fourth conductive portions 304 in the first direction. With the third opening zone P3 and the fourth opening zone P4, the third conductive portions 303 and the fourth conductive portions 304 do not contact one another. The third connection portion 313 electrically connects all the third conductive portions 303, and the fourth connection portion 314 electrically connects all the fourth conductive portions 304. The first connection portion 311 and the second connection portion 312 are respectively located in the third opening zone P3 and the fourth opening zone P4, and the third connection portion 313 and the fourth connection portion 314 are respectively located in the first opening zone P1 and the second opening zone P2. The first conductive portions 301 and the second conductive portions 302 are alternately arranged with the third conductive portions 303 and the fourth conductive portions 304 respectively at two opposite sides of the pattern zone. All the first conductive portions 301 electrically connected to each other through the first connection portion 311, and all the second conductive portions 302 electrically connected to each other through the second connection portion 312 can be used as two drive electrodes RX respectively to receive drive signals. All the third conductive portions 303 electrically connected to each other through the third connection portion 313, and all the fourth conductive portions 304 electrically connected to each other through the fourth connection portion 314 can be used as two emitting electrodes TX respectively to transmit the sensed signals to a controller.

The specific shapes of the first conductive portions 301, the second conductive portions 302, the third conductive portions 303 and the fourth conductive portions 304 can be designed according to the shapes of the hollow portion 24 and a non hollow portion 25. For example, the first conductive portions 301, the second conductive portions 302, the third conductive portions 303 and the fourth conductive portions 304 shown in FIG. 3A are all in a shape of a semicircle arc, and the first conductive portions 301, the second conductive portions 302, the third conductive portions 303 and the fourth conductive portions 304 shown in FIG. 3B are substantially strip-shaped.

Figure 4:
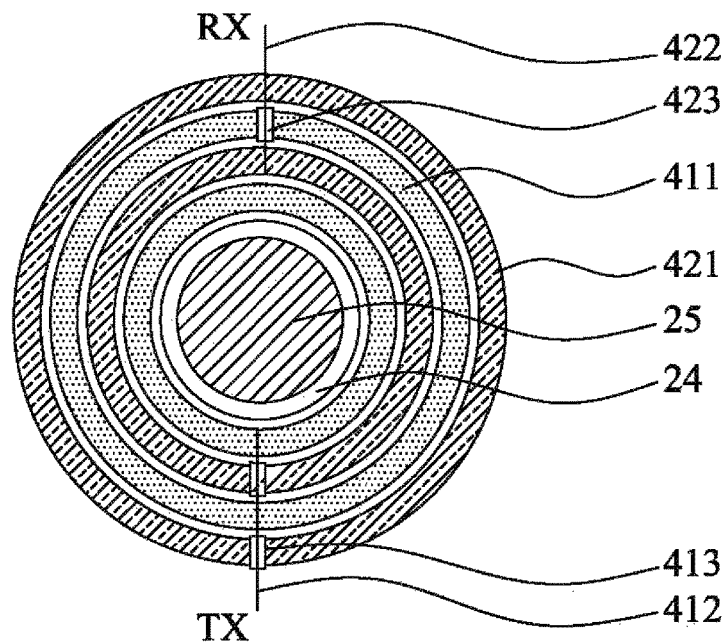
FIG. 4 is a schematic diagram showing a pattern zone sensing structure in accordance with one or more embodiments of the disclosure.

FIG. 4 is a schematic diagram showing a pattern zone sensing structure in accordance with one or more embodiments of the disclosure. Referring to FIG. 4, the difference between the pattern zone sensing structure of the present embodiments and the embodiments shown in FIG. 2B is that a first electrode includes various circular rings 411 and a first connection portion 412 connecting the first circular rings 411, and a second electrode includes various second circular rings 421 and a second connection portion 422 connecting the second circular rings 421, in which the first circular rings 411 and the second circular rings 421 are alternately arranged. In some embodiments, all the first circular rings 411 electrically connected to each other through the first connection portion 412 are used as a drive electrode RX for receiving a drive signal. In some embodiments, all the second circular rings 421 electrically connected to each other through the second connection portion 422 are used as an emitting electrode TX for transmitting the sensed signal to a controller. A first insulation bump 413 is disposed between the second circular rings 421 and the first connection portion 412, and a second insulation bump 423 is disposed between the first circular rings 411 and the second connection portion 422, so that the first electrode and the second electrode are electrically insulated.

Figure 5:
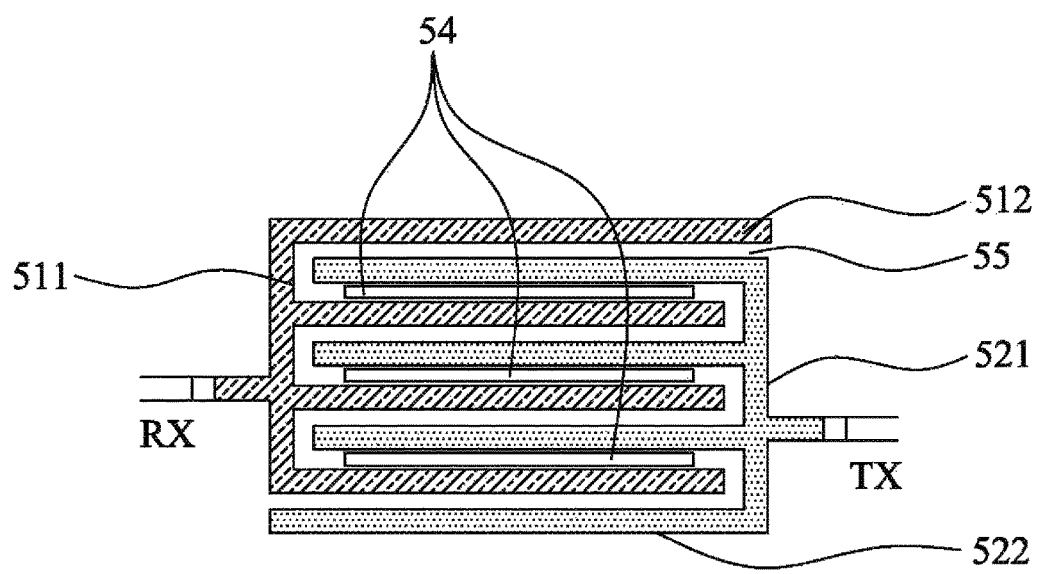
FIG. 5 is a schematic diagram showing a pattern zone sensing structure in accordance with one or more embodiments of the disclosure.

FIG. 5 is a schematic diagram showing a pattern zone sensing structure in accordance with one or more embodiments of the disclosure. Referring to FIG. 5, the difference between the pattern zone sensing structure of the present embodiments and the embodiments shown in FIG. 2B is that a non hollow portion 55 is located around a hollow portion 54 in a pattern zone, a sensing layer includes a first electrode and a second electrode, the first electrode includes a first vertical pole portion 511 and various first horizontal pole portions 512, and the first horizontal pole portions 512 are parallel to each other and electrically connected to each other through the first vertical pole portion 511. The second electrode includes a second vertical pole portion 521 and various second horizontal pole portions 522, and the second horizontal pole portions 522 are parallel to each other and electrically connected to each other through the second vertical pole portion 521. The first electrode and the second electrode are substantially comb-shaped. The first vertical pole portion 511 and the second vertical pole portion 521 are parallel to one another and located at two opposite sides of the hollow portion 54. The first horizontal pole portions 512 and the second horizontal pole portions 522 are parallel to each other, various gaps are formed between the first horizontal pole portions 512 and the second horizontal pole portions 522, and the hollow portions 54 are located in the gaps. The first electrode composed of the first vertical pole portion 511 and the first horizontal pole portions 512 can be used as a drive electrode RX for receiving a drive signal. The second electrode composed of the second vertical pole portion 521 and the second horizontal pole portions 522 can be used as an emitting electrode TX for transmitting the sensed signal to a controller.

Figure 6:
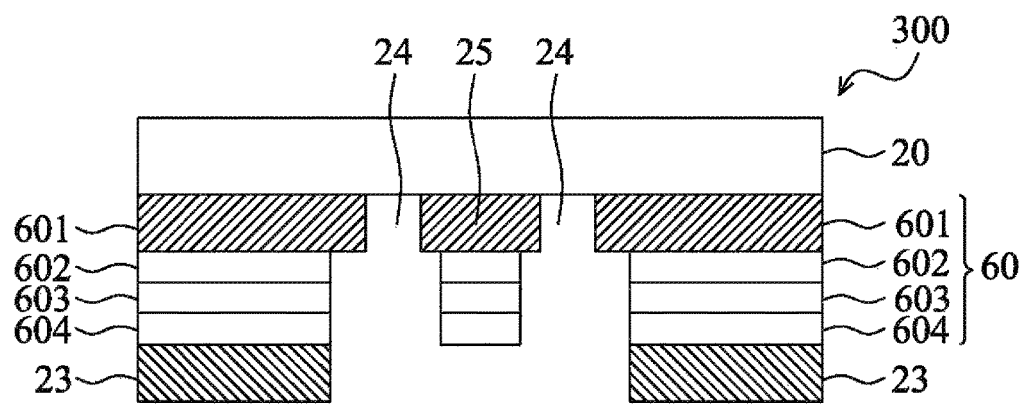
FIG. 6 is a schematic diagram showing a cover plate structure of a touch panel in accordance with one or more embodiments of the disclosure.

FIG. 6 is a schematic diagram showing a cover plate structure of a touch panel in accordance with one or more embodiments of the disclosure. Referring to FIG. 6, the difference between a cover plate structure 300 of a touch panel provided by the present embodiments and the embodiments shown in FIG. 2A through FIG. 2C is that the structures of the shielding layers are different. In the present embodiments, a shielding layer 60 includes various opaque insulation layers stacked with one another.

Four insulation layers are illustrated for example, but the disclosure is not limited to using four insulation layers to form a shielding layer. According to the materials and the thicknesses of the shielding layers, a single insulation layer or various insulation layers are stacked with each other in accordance with various embodiments. The shielding layer 60 includes a first insulation layer 601, a second insulation layer 602, a third insulation layer 603 and a fourth insulation layer 604, and the first insulation layers 601 through 604 are sequentially stacked along a direction toward a sensing layer 23. In some embodiments, side surfaces of the first insulation layer 601 and the second insulation layer 602 adjacent to one side of a hollow portion 24 form a shape of a ladder, e.g. a side of the second insulation layer 602 adjacent to the hollow portion 24 is indented in comparison with the first insulation layer 601. Thus, during the formation of the second insulation layer 602 being performed on the first insulation layer 601, the second insulation layer 602 is prevented from falling into the hollow portion 24 due to manufacturing tolerance that would degrade the appearance effect of the touch panel. Of course, in some embodiments, the other insulation layers formed after the second insulation layer 602 are indented from a boundary of the first insulation layer 601 or a boundary of the last insulation layer to assure that all the insulation layers do not fall into the hollow portion 24.

In some embodiments, the first insulation layer 601, the second insulation layer 602 and the third insulation layer 603 are formed from a white or colored insulating printing ink, and the fourth insulation layer 604 is formed from a black insulating printing ink. Usually, a shielding effect of the white or colored printing ink is worse than that of the black printing ink, so that the white printing ink is formed with greater thickness. Finally, a layer of black printing ink is disposed to enhance a shielding effect of the entire shielding layer. In other techniques, the sensing layer usually needs to leap over the hollow portion. However, when the shielding layer is composed of various stacked printing ink layers, the level difference between the hollow portion and the shielding layer is greater, so that the sensing layer is fractured easily. In the cover plate structure provided by the disclosure, the sensing layer is disposed on the shielding layer and does not need to leap over the level difference between the hollow portion and the shielding layer, so that the sensing layer is not easily fractured.

Figure 7:
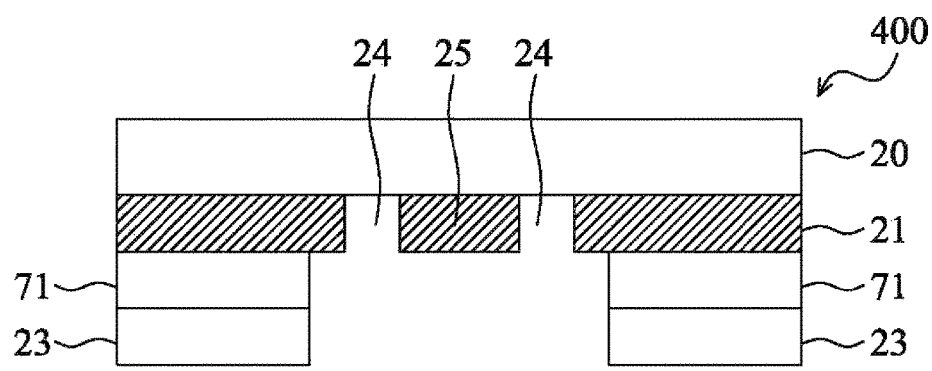
FIG. 7 is a schematic diagram showing a cover plate structure of a touch panel in accordance with one or more embodiments of the disclosure.

FIG. 7 is a schematic diagram showing a cover plate structure of a touch panel in accordance with one or more embodiments of the disclosure. Referring to FIG. 7, the difference between a cover plate structure 400 of a touch panel provided by the present embodiments and the embodiments shown in FIG. 2A through FIG. 2C is that the cover plate structure 400 further includes a fifth insulation layer 71. The fifth insulation layer 71 is disposed between a sensing layer 23 and a shielding layer 21, and the fifth insulation layer 71 does not overlap with a hollow portion 24 and a non hollow portion 25 in a pattern zone.

A material of the fifth insulation layer 71 is a transparent insulating organic material or a transparent insulating inorganic material, including polyimide (PI), silicon dioxide ($SiO_2$), silicon nitride (SiN), silicon oxynitride (SiON), silicon carbide (SiC), etc. The shielding layer 21 is typically formed by printing one or more opaque insulating ink layers. The surface of the printing ink is usually not very even due to printing ink materials and a printing process, so that an insulating material layer added on the shielding layer 21 can provide a relatively smooth surface for the sensing layer 23 formed subsequently, thereby increasing the yield of the touch panel.

Figure 8A:
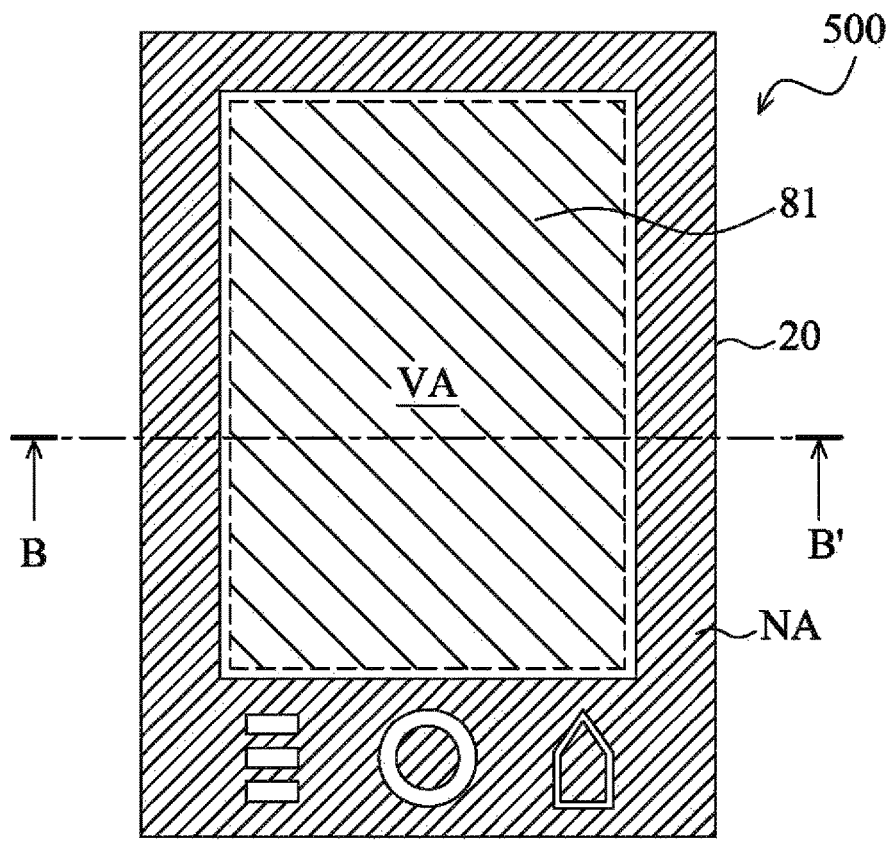
FIG. 8A is a schematic diagram showing a touch panel structure in accordance with one or more embodiments of the disclosure.
Figure 8B:
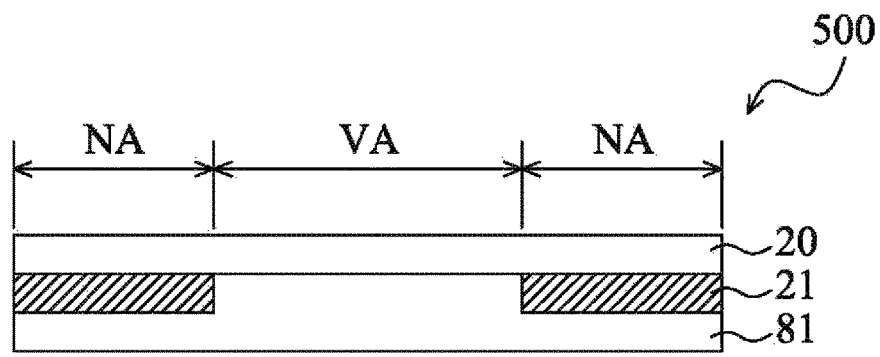
FIG. 8B is a cross-sectional view taken along a line BB' of FIG. 8A in accordance with one or more embodiments of the disclosure.

The embodiments of the disclosure further provide a touch panel. FIG. 8A is a schematic diagram showing a touch panel structure in accordance with one or more embodiments of the disclosure. FIG. 8B is a cross-sectional view taken along a line BB' of FIG. 8A in accordance with one or more embodiments of the disclosure.

Referring to FIG. 8A and FIG. 8B, a touch panel 500 provided by the present embodiments includes a cover plate structure of a touch panel provided by any one of the aforementioned embodiments and a conductive layer 81, in which the cover plate structure is illustrated by using the embodiments shown in FIG. 2A through FIG. 2C. The touch panel 500 includes a cover plate 20, a shielding layer 21 and a conductive layer 81. The shielding layer 21 is disposed on the cover plate 20 to define the cover plate 20 with a non-visible area NA and a visible area VA, in which the non-visible area NA is located around the visible area VA.

The conductive layer 81 is disposed on the cover plate 20 and is located in the visible area VA. The conductive layer 81 is provided for a user to perform touch operations within the range of the visible area VA. The conductive layer 81 may be a common single-layered touch sensing layer or a common multi-layered touch sensing layer. A material of the conductive layer 81 includes a transparent conductive material. The conductive layer 81 of the touch panel provided by the present embodiments is directly formed on the cover plate 20, and a substrate for carrying the conductive layer 81 is not needed additionally, so that the touch panel is more compact.

Figure 9:
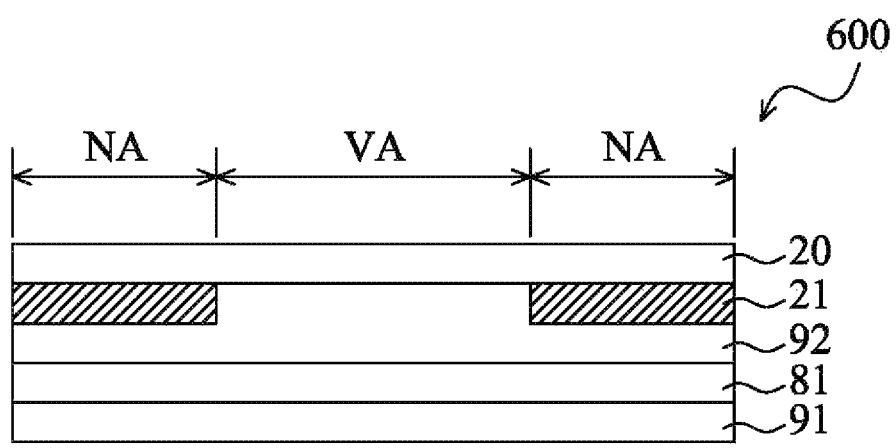
FIG. 9 is a schematic diagram showing a touch panel structure in accordance with one or more embodiments of the disclosure.

FIG. 9 is a schematic diagram showing a touch panel structure in accordance with one or more embodiments of the disclosure. Referring to FIG. 9, the difference between a touch panel 600 of the present embodiment and the touch panel of the embodiment shown in FIG. 8A and FIG. 8B is that the touch panel 600 further includes a substrate 91, the substrate 91 is located under the cover plate 20, and a conductive layer 81 is disposed on the substrate 91. In some embodiments, the conductive layer 81 and the cover plate 20 are adhered to each other via an adhesive layer 92. In some embodiments, the conductive layer 81 is a single-layered touch sensing layer or a multi-layered touch sensing layer. A material of the conductive layer 81 includes a transparent conductive material. A material of the adhesive layer 92 includes a transparent optical clear adhesive (OCA), a liquid adhesive, or the like. The other devices correspond to the devices of the embodiments shown in FIG. 8A and FIG. 8B, so detailed description thereof is not repeated here for brevity.

In the aforementioned embodiments, materials of the first electrode and the second electrode are transparent conductive materials or opaque conductive materials. The transparent conductive materials include indium tin oxide (ITO), indium zinc oxide (IZO), cadmium tin oxide (CTO), aluminum zinc oxide (AZO), indium tin zinc oxide (ITZO), etc. The opaque conductive materials include metal or alloy. The first electrode and the second electrode may be formed by a printing process, or a sputtering and photolithographic process. Materials of the cover plate and the substrate include transparent materials, such as glass, polymethylmethacrylate (PMMA), polyvinyl chloride (PVC), polypropylene (PP), polyethylene terephthalate (PET), polyethylene napthalate (PEN), polycarbonate (PC) and polystyrene (PS).

In a touch panel, a cover plate structure of the touch panel and a sensing structure of a touch panel provided by the embodiments of the disclosure, a sensing layer is arranged under a shielding layer and located around a hollow portion, so that the sensing layer is covered by the shielding layer and avoids a hollow portion of a pattern zone, so that the sensing layer cannot be seen through the hollow portion, and the appearance quality of the touch panel is improved.

The foregoing preferred embodiments of the disclosure are illustrative of the disclosure rather than limiting of the disclosure. Various changes, substitutions, and modifications made within the spirit and scope of the disclosure should be encompassed within the scope of the appended claims.

Although the present disclosure has been described with reference to the embodiments, however it is not intended to limit the scope of the present disclosure. Various changes, substitutions, and alterations may be made by one skilled in the art without departing from the spirit and scope the present disclosure. Therefore, the scope of the present disclosure is as defined in the appended claims.

What is claimed is:

1. A sensing structure of a touch panel, comprising:
   a shielding layer having a hollow portion; and
   a sensing layer arranged under the shielding layer and located around the hollow portion, wherein the sensing layer does not overlap with the hollow portion.

2. The sensing structure of a touch panel of claim 1, wherein the shielding layer has a pattern zone composed of the hollow portion and a non hollow portion, and the hollow portion is located around the non hollow portion.

3. The sensing structure of a touch panel of claim 1, wherein the shielding layer has a pattern zone composed of the hollow portion and a non hollow portion, and the non hollow portion is located around the hollow portion.

4. The sensing structure of a touch panel of claim 2, wherein the sensing layer comprises at least one first electrode and at least one second electrode, the first electrode and the second electrode are alternately arranged and surround the pattern zone, and the first electrode and the second electrode are electrically insulated from one another.

5. The sensing structure of a touch panel of claim 4, wherein the first electrode comprises a plurality of first circular arcs and a first connection portion connecting the first circular arcs, the second electrode comprises a plurality of second circular arcs and a second connection portion connecting the second circular arcs, the first circular arcs and the second circular arcs are alternately arranged, the second connection portion is located in a first opening zone formed by the first circular arcs, and the first connection portion is located in a second opening zone formed by the second circular arcs.

6. The sensing structure of a touch panel of claim 4, wherein the first electrode comprises a first conductive portion and a second conductive portion arranged along a first direction opposite to each other, a first connection portion connected to the first conductive portion and a second connection portion connected to the second conductive portion, a first opening zone and a second opening zone are formed between the first conductive portion and the second conductive portion in a second direction, the second electrode comprises a third conductive portion and a fourth conductive portion arranged along the second direction opposite to each other, a third connection portion connected to the third conductive portion and a fourth connection portion connected to the fourth conductive portion, a third opening zone and a fourth opening zone are formed between the third conductive portion and the fourth conductive portion in the first direction, the first connection portion and the second connection portion are respectively located in the third opening zone and the fourth opening zone, the third connection portion and the fourth connection portion are respectively located in the first opening zone and the second opening zone, and the first conductive portion and the second conductive portion are alternately arranged with the third conductive portion and the fourth conductive portion respectively at two opposite sides of the pattern zone.

7. The sensing structure of a touch panel of claim 4, wherein the first electrode comprises a plurality of first circular rings and a first connection portion connecting the first circular rings, the second electrode comprises a plurality of second circular rings and a second connection portion connecting the second circular rings, the first circular rings and the second circular rings are alternately arranged, a first insulation bump is disposed between the second circular rings and the first connection portion, and a second insulation bump is disposed between the first circular rings and the second connection portion.

8. The sensing structure of a touch panel of claim 1, wherein the sensing layer comprises a first electrode and a second electrode, the first electrode comprises a first vertical pole portion and a plurality of first horizontal pole portions, the first horizontal pole portions are parallel to each other and electrically connected to each other through the first vertical pole portion, the second electrode comprises a second vertical pole portion and a plurality of second horizontal pole portions, the second horizontal pole portions are parallel to each other and electrically connected to each other through the second vertical pole portion, the first vertical pole portion and the second vertical pole portion are parallel to each other, the first horizontal pole portions and the second horizontal pole portions are parallel to each other, a plurality of gaps are formed between the first horizontal pole portions and the second horizontal pole portions, and the hollow portion is located in the gaps.

9. The sensing structure of a touch panel of claim 1, wherein the shielding layer comprises a plurality of opaque insulation layers stacked with one another.

10. The sensing structure of a touch panel of claim 9, wherein the shielding layer comprises a first insulation layer, a second insulation layer, a third insulation layer and a fourth insulation layer, and the first insulation layer, the second insulation layer, the third insulation layer and the fourth insulation layer are sequentially stacked along a direction toward the sensing layer.

11. The sensing structure of a touch panel of claim 10, wherein side surfaces of the first insulation layer and the second insulation layer adjacent to one side of the hollow portion form a shape of a ladder.

12. The sensing structure of a touch panel of claim 10, wherein the first insulation layer, the second insulation layer and the third insulation layer are formed form a white insulating printing ink, and the fourth insulation layer is formed from a black insulating printing ink.

13. The sensing structure of a touch panel of claim 1, further comprising an insulation layer disposed between the sensing layer and the shielding layer.

14. The sensing structure of a touch panel of claim 13, wherein a material of the insulation layer is a transparent insulating organic material or a transparent insulating inorganic material.

15. The sensing structure of a touch panel of claim 14, wherein materials of the first electrode and the second electrode are opaque conductive materials.

16. A cover plate structure of a touch panel, comprising:
a cover plate; and
a sensing structure disposed on the cover plate, wherein the sensing structure comprises:
a shielding layer having a hollow portion; and
a sensing layer arranged under the shielding layer and located around the hollow portion, wherein the sensing layer does not overlap with the hollow portion, and the shielding layer is located between the cover plate and the sensing layer.

17. The cover plate structure of the touch panel of claim 16, further comprising a conductive layer, wherein the shielding layer divides the cover plate into a visible area and a non-visible area, the shielding layer is located in the non-visible area, and the conductive layer is disposed on the cover plate in the visible area.

18. A touch panel, comprising:
a cover plate having a visible area and a non-visible area;
a substrate located under the cover plate;
a sensing structure disposed between the cover plate and the substrate in the non-visible area, wherein the sensing structure comprises:
a shielding layer having a hollow portion; and
a sensing layer arranged under the shielding layer and located around the hollow portion, wherein the sensing layer does not overlap with the hollow portion; and
a conductive layer disposed on the substrate in the visible area.

* * * * *